United States Patent [19]

Nakashiba et al.

[11] Patent Number: 5,567,632
[45] Date of Patent: Oct. 22, 1996

[54] METHOD FOR FABRICATING SOLID STATE IMAGE SENSOR DEVICE HAVING BURIED TYPE PHOTODIODE

[76] Inventors: Yasutaka Nakashiba; Satoshi Uchiya, both of c/o NEC Corporation, 7-1, Shiba 5-chome, Minato-ku, Tokyo, Japan

[21] Appl. No.: 137,219

[22] Filed: Oct. 18, 1993

Related U.S. Application Data

[62] Division of Ser. No. 992,102, Dec. 17, 1992, abandoned.

[30] Foreign Application Priority Data

Dec. 20, 1991 [JP] Japan ................... 3-338658

[51] Int. Cl.$^6$ ............. H01L 21/265; H01L 31/18; H01L 21/70; H01L 27/00
[52] U.S. Cl. ................. 437/35; 437/3; 437/53
[58] Field of Search ................. 257/222, 225, 257/461, 232; 437/35, 3, 50, 53

[56] References Cited

U.S. PATENT DOCUMENTS

| | | | |
|---|---|---|---|
| 3,914,857 | 10/1975 | Goser et al. | 437/35 |
| 4,484,210 | 11/1984 | Shiraki et al. | 357/24 |
| 4,805,026 | 2/1989 | Oda | 257/222 |
| 4,831,426 | 5/1989 | Kimata et al. | 257/222 |
| 4,980,735 | 12/1990 | Yamawaki | 257/222 |
| 4,984,047 | 1/1991 | Stevens | 257/461 |
| 5,043,783 | 8/1991 | Matsumoto et al. | 257/461 |
| 5,070,380 | 12/1991 | Erhardt et al. | 257/222 |
| 5,132,762 | 7/1992 | Yamada | 257/440 |
| 5,196,719 | 3/1993 | Miwada | 257/225 |

FOREIGN PATENT DOCUMENTS

| | | | |
|---|---|---|---|
| 62-155559 | 7/1987 | Japan | 257/222 |
| 2-253658 | 10/1990 | Japan | 257/222 |

OTHER PUBLICATIONS

"No Image Lag Photodiode Structure In The Interline CCD Image Sensor", Nobukazu Teranishi et al., IEDM, IEEE, Dec. 1982, pp. 324–327.

Primary Examiner—Mary Wilczewski
Assistant Examiner—Brian K. Dutton

[57] ABSTRACT

A solid state image sensor device includes: a photoelectric conversion section having a first conductivity type semiconductor thin region and a second conductivity type semiconductor region in a surface area of a first conductivity type semiconductor layer; a signal electron transfer section formed within the surface area of the first conductivity type semiconductor layer, for transferring a signal electron generated at the photoelectric conversion section; and a signal electron read-out section formed over the surface area of the first conductivity type semiconductor layer, for reading-out the signal electron from the photoelectric conversion section to the signal electron transfer section. The first conductivity type semiconductor thin region is self-aligned with respect to the second conductivity type semiconductor region and this is achieved by using the same mask and controlling the angles of incidence in the ion implantation. It is possible to prevent occurrence of a potential well or a potential barrier which may otherwise occur under the electrode in case any misalignment develops during the photolithography process or any dimension deviation in the electrodes develops during the fabrication and it is possible to enhance the efficiency in which the signal electron is read-out from the photoelectric conversion section.

13 Claims, 9 Drawing Sheets

METHOD FOR FABRICATING SOLID STATE IMAGE SENSOR DEVICE HAVING BURIED TYPE PHOTODIODE

This application is a divisional of application Ser. No. 07/922,102, filed Dec. 17, 1992 now abandoned.

BACKGROUND OF THE INVENTION

1. Field of the Invention

The present invention relates to a solid state image sensor device, and more particularly to a solid state image sensor device and a method for fabricating the same, which has a buried type photodiode for a photoelectric conversion section.

2. Description of the Related Art

In a conventional solid state image sensor device of the type to which the present invention relates, an $N^-$-P junction photodiode is used in its photoelectric conversion section. With the $N^-$-P Junction photodiode, due to the generation of a current based on Silicon-Silicon dioxide interface electron energy when the surface of the $N^-$-region is completely depleted, there is an increase in a noise component which is not due to photoelectric conversion. This current is called a dark current and it causes the signal/noise ratio (S/N ratio) to be deteriorated under a condition of low illumination.

As a method for decreasing the dark current, Teranishi et al has proposed in the Japanese Patent Application Kokai No. Sho 57-62557 (A), a buried photodiode for use in a photoelectric conversion section of a solid state image pickup device, in which a highly doped $P^+$-type region is formed on a surface of an N-type region of the photodiode and, by fixing the potential thereof to the reference potential, the $P^+$-type region at the surface is confined to the non-depletion region even when the N-type region is completely depleted and the cause for the generation of the dark current is eliminated.

FIGS. 1 to 8 are sectional views of a cell section of a conventional solid state image sensor device which uses a buried type photodiode in a photoelectric conversion section, for explaining the sequential fabrication steps thereof.

First, a P-type well layer 2 is formed on an N-type semiconductor substrate 1 (FIG. 1).

Then, a silicon oxide film 3 and a silicon nitride film 4 are sequentially grown on the P-type well layer 2. A photoresist 5a is applied on the silicon nitride film 4 and is subjected to exposure and development processes. Thereafter, the silicon nitride film 4 at a portion to become the photoelectric conversion section is selectively removed using a plasma-etching process (FIG. 2).

Next, with the photoresist 5a and the silicon nitride film 4 used as masks, ion implantation is performed whereby an N-type region 6 of the photoelectric conversion section is formed (FIG. 3).

Then, the photoresist 5a and the silicon nitride film 4 are removed using a wet-etching process. Thereafter, a portion other than the signal electron transfer section is covered by a photoresist 5b using a photolithography technique. With the photoresist 5b used as a mask, ion implantation is performed whereby an N-type region 8 of the signal electron transfer section is formed (FIG. 4).

Next, by using a photolithography technique, a photoresist 5c is applied to cover the signal electron read-out section, the photoelectric conversion section and the signal electron transfer section and, by using this photoresist 5c as a mask, ion implantation is performed whereby a $P^+$-type region 9 to serve as an element isolation portion is formed (FIG. 5).

Thereafter, the photoresist 5c is removed and, after the silicon oxide film 3 is etched away, a first gate insulating film (not shown) is formed by a thermal oxidation process. Then, a polycrystalline silicon film is deposited by a low-pressure chemical vapor deposition (LPCVD) method and, by using a photolithography technique and a dry-etching method, a first polycrystalline silicon electrode (not shown) for transferring signal electrons is formed. With the first polycrystalline silicon electrode used as a mask, the first gate insulating film is etched away and a second gate insulating film 10 is formed by a thermal oxidation process newly performed. Then, by using the same technique and method as used for forming the first polycrystalline silicon electrode, there is formed a second polycrystalline silicon electrode 11 for reading-out signal electron and for transferring signal electron from the photoelectric conversion section to the signal electron transfer section (FIG. 6).

Further, the second gate insulating film 10 which is exposed is etched back and, after a silicon oxide film 12 is formed by a further thermal oxidation process, ion implantation is performed with the polycrystalline silicon electrode 11 used as a mask whereby a shallow $P^+$-type region 13 is formed in a surface area of the photoelectric conversion section (FIG. 7).

Lastly, after an interlayer insulating film 14 is formed, contact holes (not shown) are formed therein on the first and second polycrystalline silicon electrodes, and a metal film serving both as a light-shielding film 15 and a wiring film (not shown) is formed using a photolithography technique and a dry-etching method, whereby a conventional solid state image sensor device having a buried photodiode at its photoelectric conversion section is obtained (FIG. 8).

In the above explained conventional solid state image sensor device which has a buried photodiode as a photoelectric conversion section, since the N-type region 6 of the photoelectric conversion section and the $P^+$-type region at the surface layer thereof are formed by processes different from each other, it is difficult to confine, within a predetermined range, the overlapping dimension between the N-type region of the photoelectric conversion section and the polycrystalline silicon electrode, due to any misalignment which may occur in the course of photolithography process or to dimension deviations of the electrodes.

For example, in the case where the overlapped dimension shown by "X" in FIG. 9A is large, a deep potential well is formed under the polycrystalline silicon electrode 11 as shown with A in the graph of FIG. 9B. Conversely, in the case where this overlapped dimension "X" is small as shown with B in FIG. 10A, a potential barrier is formed under the polycrystalline silicon electrode 11 as shown in the graph of FIG. 10B. It is noted that, in either of the above cases, smooth transfer of signal electrons from the photoelectric conversion section to the signal electron transfer section is hindered, which is a disadvantage in the conventional arrangement.

SUMMARY OF THE INVENTION

It is, therefore, an object of the invention to overcome the problems in the conventional solid state image sensor device and to provide an improved solid state image sensor device.

According to one aspect of the invention, there is provided a solid state image sensor device comprising:

a photoelectric conversion section formed in a surface area of a first conductivity type semiconductor layer, and having a first conductivity type semiconductor thin region and a second conductivity type semiconductor region, the first conductivity type semiconductor thin region being self-aligned with respect to the second conductivity type semiconductor region;

a signal electron transfer section formed within the surface area of the first conductivity type semiconductor layer, for transferring a signal electron generated at the photoelectric conversion section; and a signal electron read-out section formed over the surface area of the first conductivity type semiconductor layer, for reading-out the signal electron from the photoelectric conversion section to the signal electron transfer section.

According to another aspect of the invention, there is also provided a method for fabricating a solid state image sensor device, the method comprising the steps of:

forming, on a first conductivity type semiconductor layer, a second conductivity type semiconductor region serving as a photoelectric conversion section by ion implantation using-lithographic technique; and forming a first conductivity type semiconductor thin region with a common mask used and angles of incidence controlled in the ion implantation so that the first conductivity type semiconductor thin region is self-aligned with respect to the second conductivity type semiconductor region with a shift in the order of 0.15 μm being provided therebetween.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, the present invention is explained with reference to the accompanying drawings. It is to be noted that, throughout the following explanation, similar reference symbols or numerals refer to the same or similar elements in all the figures of the drawings.

FIGS. 11–19 relate to a first embodiment according to the present invention and show in sectional views a cell section of a solid state image sensor device adopting a buried photodiode in a photoelectric conversion section, for explaining the sequential fabrication steps thereof.

Figure 1:
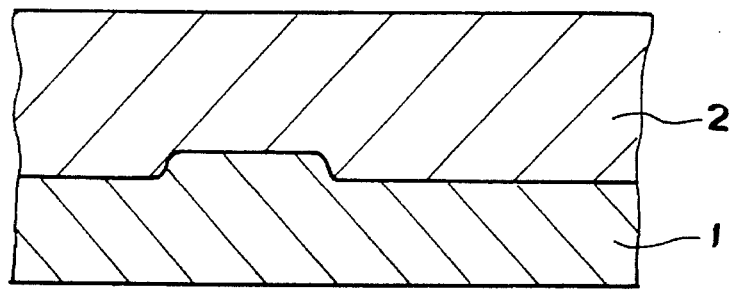
FIGS. 1 to 8 are sectional views of a cell section of a conventional solid state image sensor device for illustrating its sequential fabrication steps.
Figure 2:
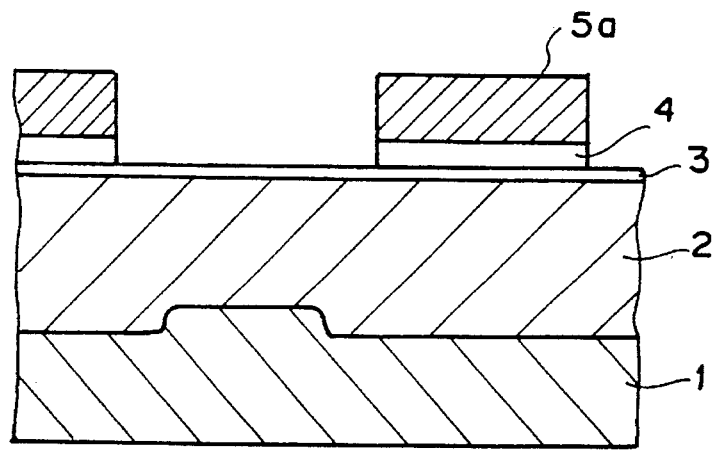
Figure 3:
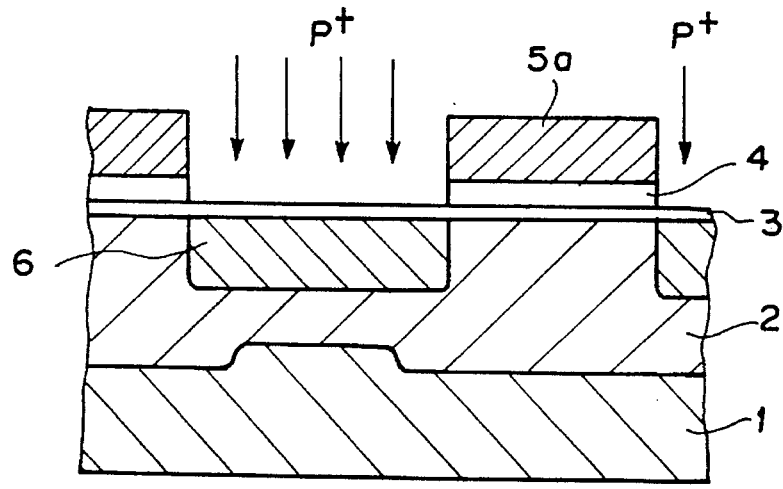
Figure 4:
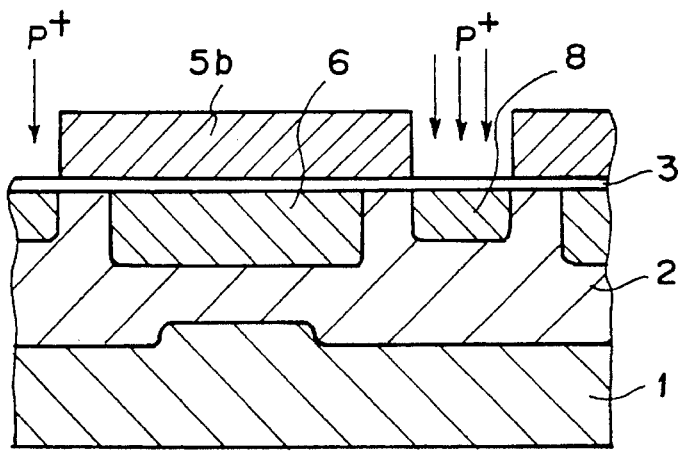
Figure 5:
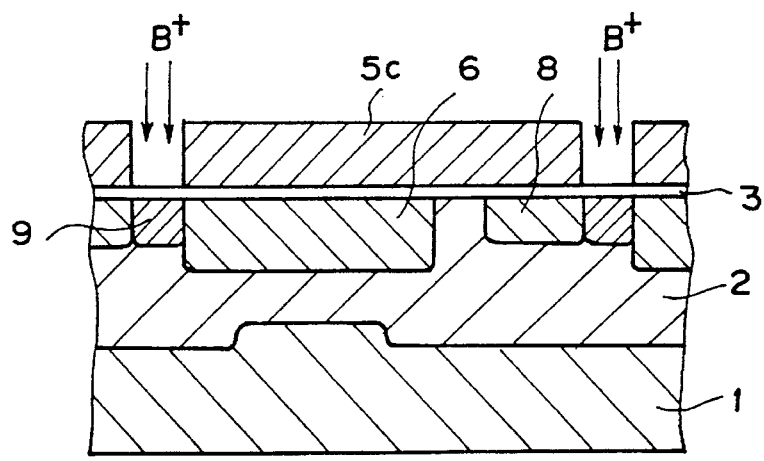
Figure 6:
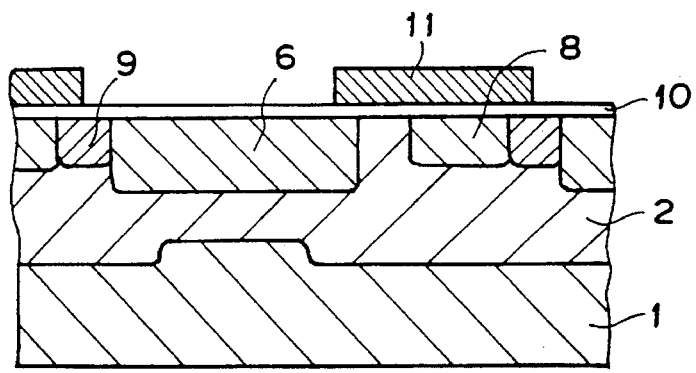
Figure 7:
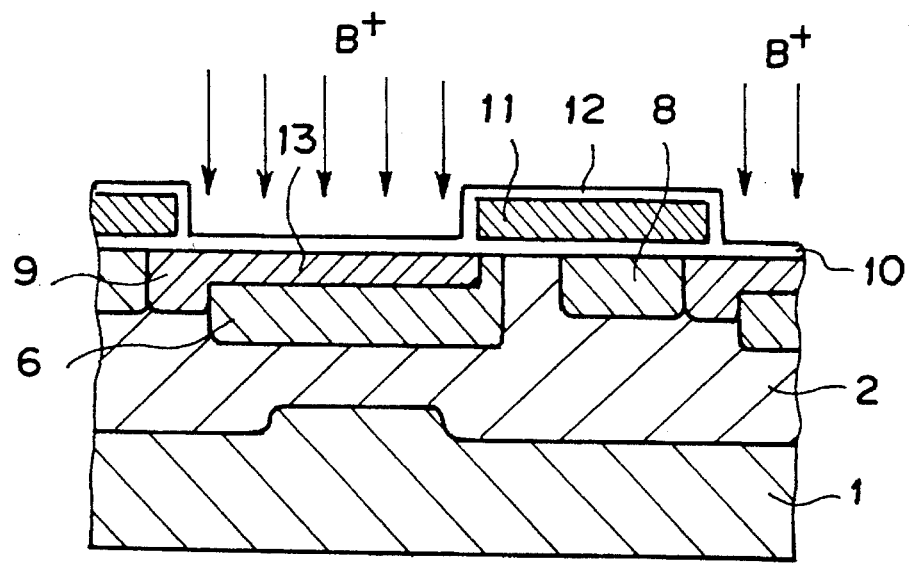
Figure 8:
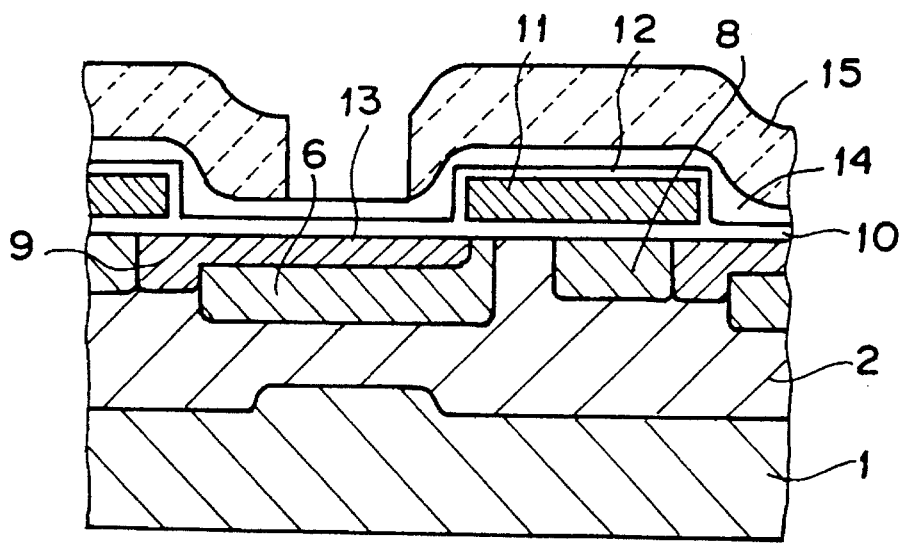
Figure 9A:
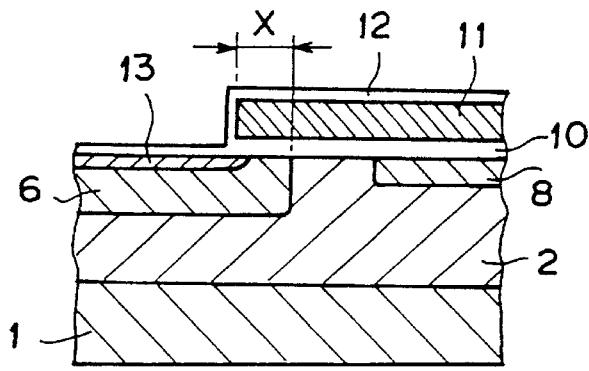
FIG. 9A is a sectional view of a portion of the conventional solid state image sensor device.
Figure 9B:
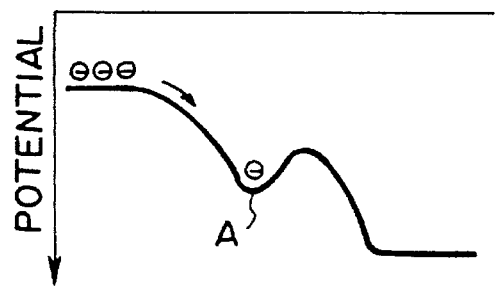
FIG. 9B is a graph showing a potential distribution in the conventional device shown in FIG. 9A.
Figure 10A:
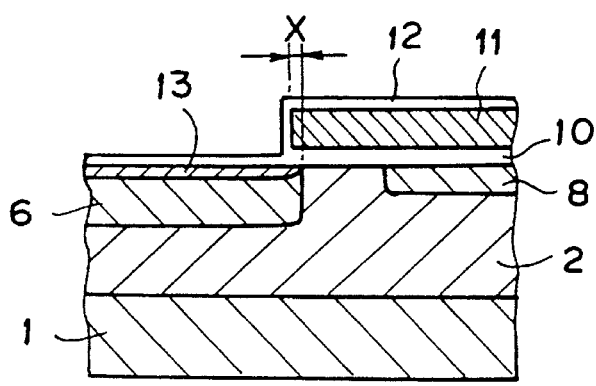
FIG. 10A is a sectional view of a portion of the conventional solid state image sensor device.
Figure 10B:
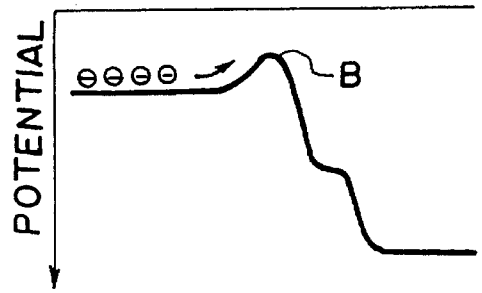
FIG. 10B is a graph showing a potential distribution in the conventional device shown in FIG. 10A.
Figure 11:
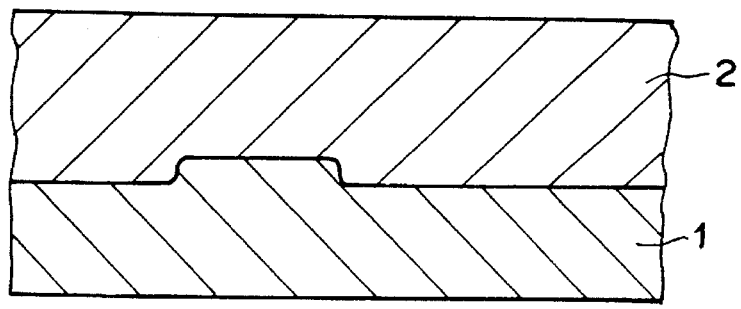
FIGS. 11 to 19 are sectional views of a cell section of a solid state image sensor device as a first embodiment according to the present invention, for illustrating its sequential fabrication steps.

First, a P-type well layer 2 is formed on an N-type semiconductor substrate 1 (FIG. 11).

Figure 12:
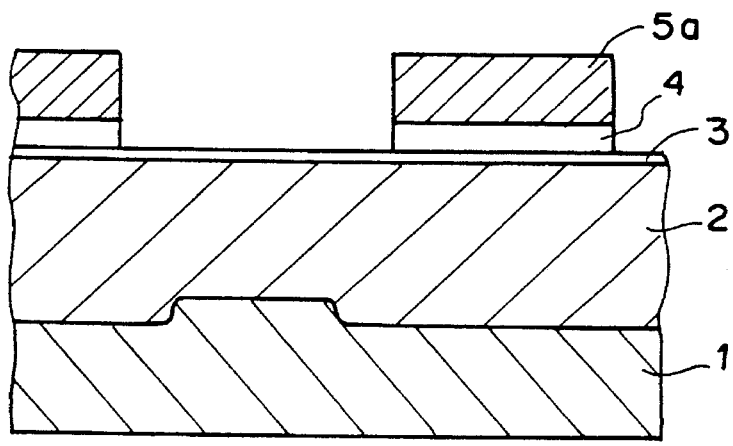

Then, a silicon oxide film 3 of about 60 nm thick and a silicon nitride film 4 of about 120 nm thick are sequentially formed on the P-type well layer 2. A photoresist 5a is applied on the silicon nitride film 4 and is subjected to exposure and development process. Thereafter, the silicon nitride film 4 at a portion to become the photoelectric conversion section is selectively removed using a plasma-etching process (FIG. 12).

Figure 13:
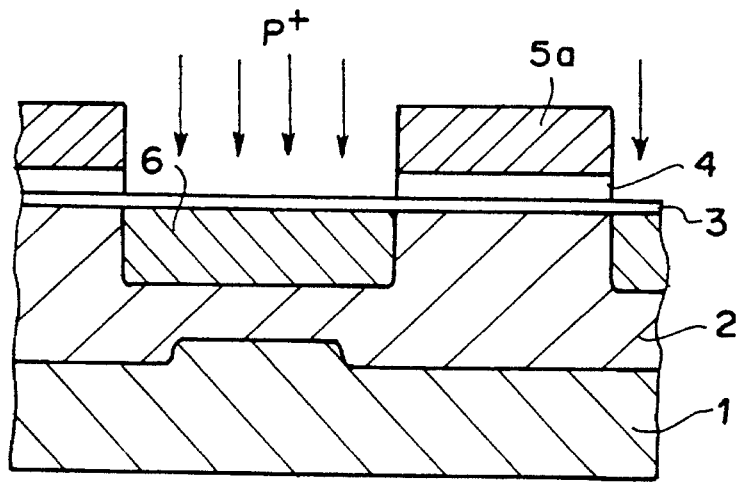

Next, with the photoresist 5a of about 1.1 μm thick and the silicon nitride film 4 used as masks, ion implantation (for example, phosphor (P) of $4.00 \times 10^{12}$ cm$^{-2}$) is performed whereby an N-type region 6 of the photoelectric conversion section is formed (FIG. 13).

Figure 14:
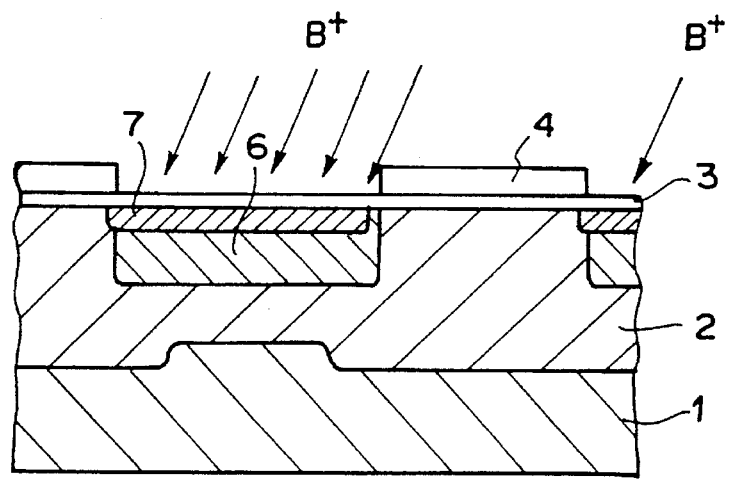

Next, the photoresist 5a is removed using a wet-etching process and, thereafter, ion implantation (for example, boron (B) of $1.00 \times 10^{13}$ cm$^{-2}$) at an angle of about 40° with respect to the normal line is performed whereby a shallow first P-type region 7 constituting the photoelectric conversion section is formed in the surface of the photoelectric conversion section (FIG. 14). The shallow first P-type region 7 functions to fix a surface potential to a reference level.

Figure 15:
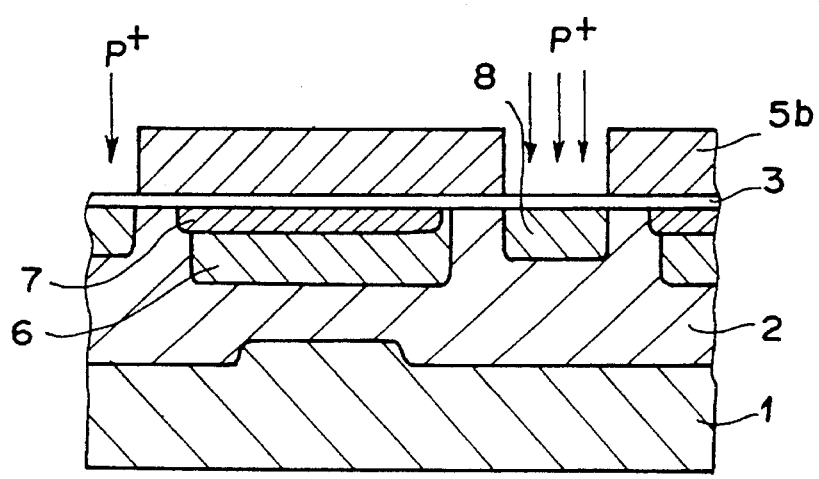

Then, the silicon nitride film 4 is removed using a wet-etching process and, thereafter, a portion other than the signal electron transfer section is covered by a photoresist 5b using a photolithography process. With this photoresist 5b used as a mask, ion implantation is performed whereby an N-type region 8 constituting the signal electron transfer section is formed (FIG. 15).

Figure 16:
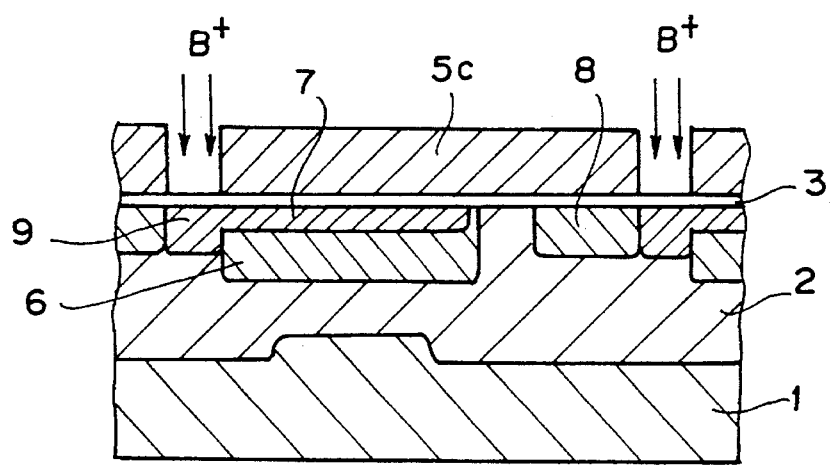

Next, a photoresist 5c is applied to cover the signal electron read-out section, the photoelectric conversion section and the signal electron transfer section by using a photolithography technique and, with this photoresist 5c used as a mask, ion implantation is performed whereby a Pa$^+$-type region 9 to serve as an element isolation portion is formed (FIG. 16).

Figure 17:
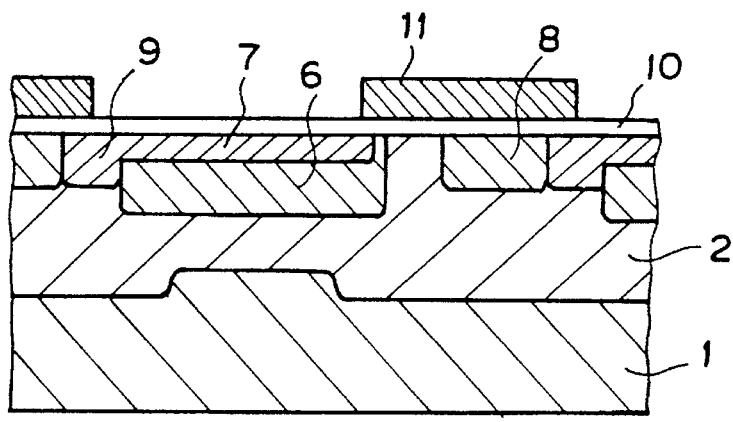

Thereafter, the photoresist 5c is removed and, after the silicon oxide film 3 is etched away, a first gate insulating film (not shown) is formed by a thermal oxidation process. Then, by using a low-pressure CVD method, a polycrystalline silicon film is deposited and, by using a photolithography technique and a dry-etching method, a first polycrystalline silicon electrode (not shown) for signal electron transfer operation is formed. With the first polycrystalline silicon electrode used as a mask, the first gate insulating film is etched away and a second gate insulating film 10 is formed by thermal oxidation newly performed. Then, by using the same technique and method as used for forming the first polycrystalline silicon electrode, there is formed a second polycrystalline silicon electrode 11 for reading-out signal electron and for transferring signal electron from the photoelectric conversion section to the signal electron transfer section (FIG. 17).

Figure 18:
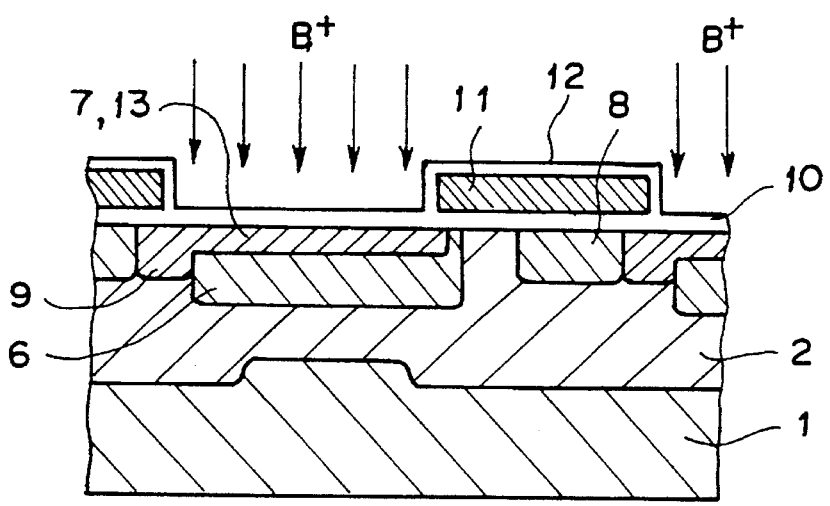

Furthermore, the second gate insulating film 10 which is exposed is etched back and, after a silicon oxide film 12 is formed by further thermal oxidation, ion implantation is performed with the polycrystalline silicon electrode 11 used as a mask, whereby a shallow second P$^+$-type region 13 is formed at a surface area of the photoelectric conversion section (FIG. 18).

Figure 19:
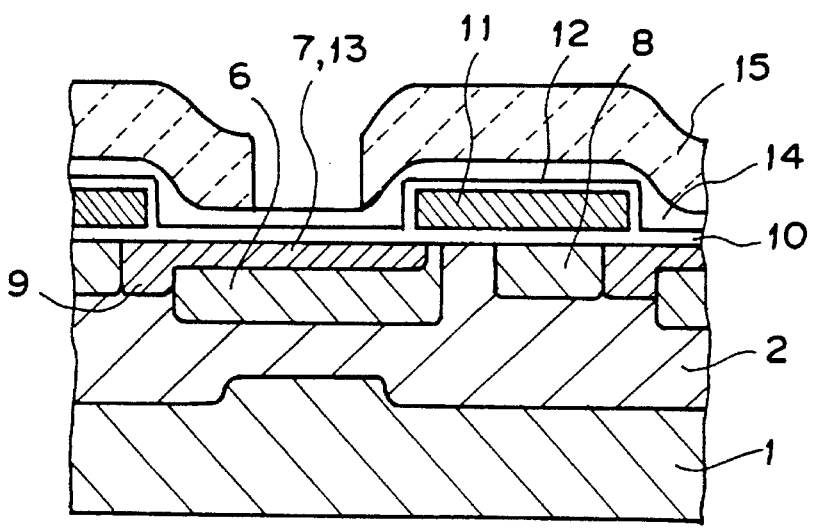

Lastly, after an interlayer insulating film 14 is formed, contact holes (not shown) are formed therein on the first and second polycrystalline silicon electrodes, and a metal film serving both as a light-shielding film 15 and a wiring film (not shown) is formed using a photolithography technique and a dry-etching method, whereby a solid state image sensor device having a buried photodiode at its photoelectric conversion section according to the first embodiment of the invention is obtained (FIG. 19).

In the above first embodiment, the shallow second $P^+$-type region 13 of the photoelectric conversion section described above is for controlling the dopant concentration of the first $P^+$-type region 7, so that it can be omitted unless specifically required.

Figure 20A:
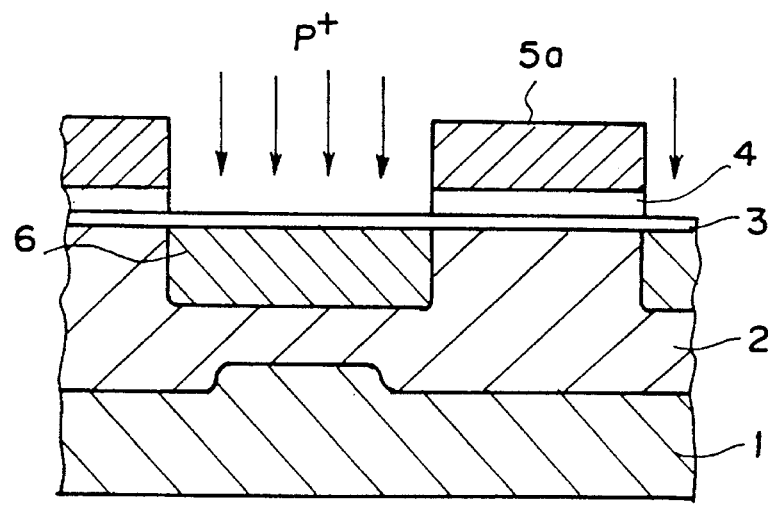
FIGS. 20A, 20B and 20C are sectional views of a cell section of the solid state image sensor device as a second embodiment according to the present invention, for illustrating its fabrication steps.

Next, the second embodiment according to the invention is explained with reference to FIGS. 20A to 20C.

In the second embodiment, the fabrication steps up to the step shown in FIG. 13 are the same as those according to the first embodiment. FIG. 20A shows the state in which the step of FIG. 13 has been completed.

Figure 20B:
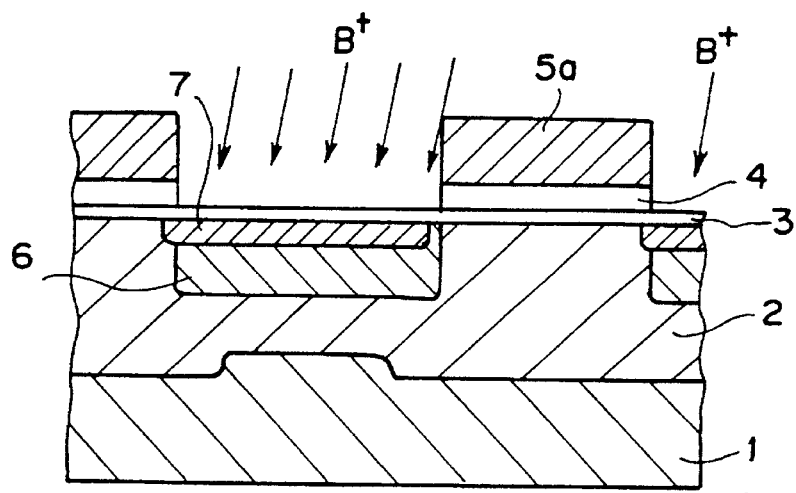
Figure 20C:
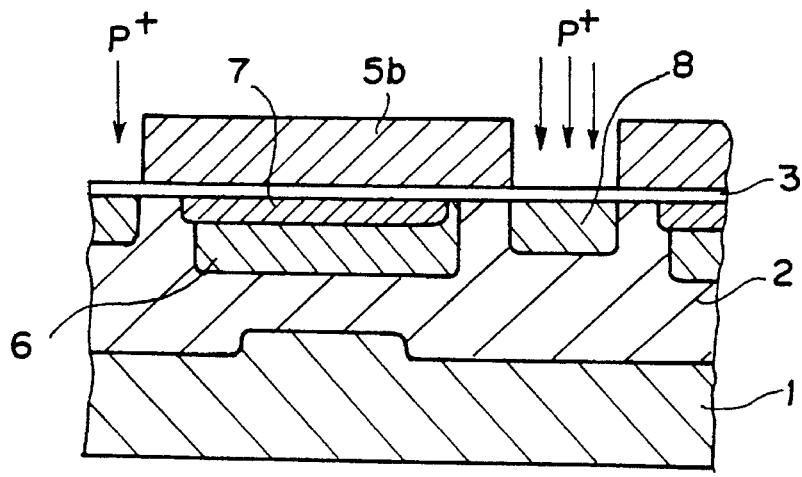

Next, a shallow first $P^+$-type region 7 for fixing a surface potential to a reference level is formed in a surface of the photoelectric conversion section by ion implantation (for example, boron (B) of $1.00\times10^{13}$ cm$^{-2}$) at an incident angle of about 7° with respect to the normal line (FIG. 20B). Then, after the photoresist 5a and the silicon nitride film 4 are removed by a wet-etching process, a portion other than the signal electron transfer section is covered by a photoresist 5b using a photolithography technique and, with this photoresist 5b used as a mask, ion implantation is performed, whereby an N-type region 8 of the signal electron transfer section is formed (FIG. 20C).

Thereafter, the respective fabrication steps shown in FIGS. 16 to 18 are carried out in the same manner as those for the first embodiment and, thus, a solid state image sensor device having a burled photodiode at its photoelectric conversion section according to the second embodiment of the invention is obtained.

As explained hereinabove, a solid state image sensor device according to tile invention comprises: a photoelectric conversion section (7, 6) having a first conductivity type semiconductor thin region (7) and a second conductivity type semiconductor region (6) in a surface area of a first conductivity type semiconductor layer (2); a signal electron transfer section (8) formed within the surface area of the first conductivity type semiconductor layer (2), for transferring a signal electron generated at the photoelectric conversion section; and a signal electron read-out section (11) formed over the first conductivity type semiconductor layer, for reading-out the signal electron from the photoelectric conversion section (7, 6) formed within the surface area of the first conductivity type semiconductor layer to the signal electron transfer section (8), characterized in that, in the photoelectric conversion section, the first conductivity type semiconductor thin region (7) is self-aligned with respect to the second conductivity type semiconductor region (6) with a predetermined shift (preferably about 0.15 μm) being provided therebetween and this is achieved by using the same mask and controlling the angles of incidence in the ion implantation. The conventional arrangement lacks a region corresponding to the first conductivity type semiconductor thin region (7) so that, due to variations in the dimensions of gate electrodes, there may occur variations in the voltages required for transferring signal electrons from the photoelectric conversion section to the signal electron transfer section. To the contrary, according to the present invention, since the second region (6) and the first conductivity type semiconductor thin region (7) are self-aligned, it is possible to stably maintain the above voltages at a low level.

According to the invention, since the physical relationship between the second conductivity type semiconductor region and the first conductivity type semiconductor region which covers the second conductivity type semiconductor region can be precisely set, it is possible to establish a precise overlapped dimension between the electrode of the signal electron read-out section for reading-out the signal electron from the photoelectric conversion section to the signal electron transfer section and the second conductivity type semiconductor region constituting the photoelectric conversion section.

Figure 21:
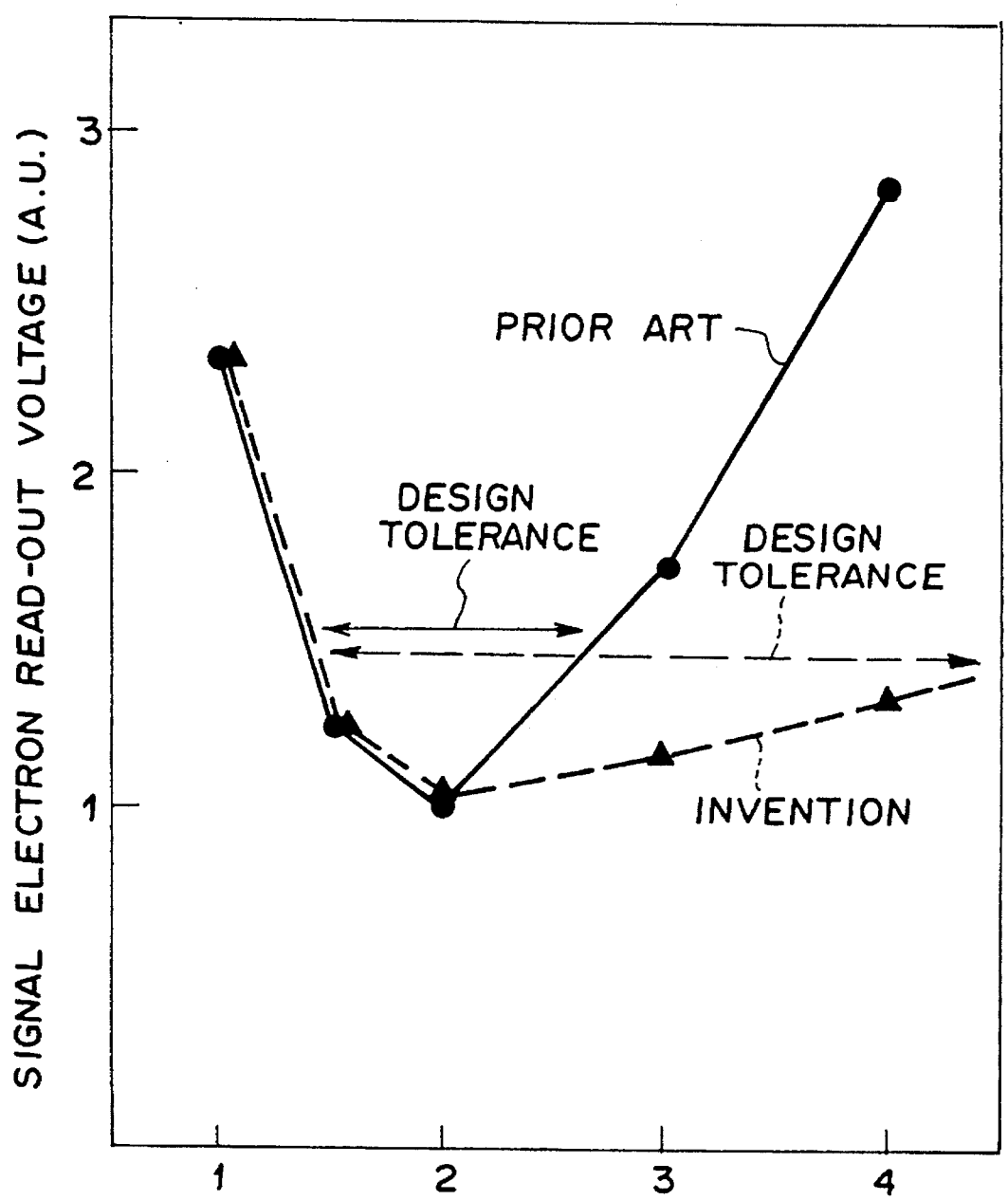
FIG. 21 is a graph showing effects of the present invention over the prior art in terms of designing tolerances.

Thus, unlike in the conventional device, the present invention enables to prevent the developments of the potential well or the potential barrier which otherwise may occur under the electrode in case any misalignment develops during the photolithography process or any dimension deviation of the electrodes develops during the fabrication and, thus, it is possible to enhance the efficiency in which the signal electron is read-out from the photoelectric conversion section. That is, since the read-out voltage can be stabilized, the designing tolerance can be maintained with sufficiency as shown in FIG. 21.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a solid state image sensor device, said method comprising the steps of:

forming a mask above a first conductivity type semiconductor layer using a lithographic technique;

forming, in said first conductivity type semiconductor layer, a second conductivity type semiconductor region serving as a photoelectric conversion section by ion implantation using said mask; and forming, in a surface area of said second conductivity type semiconductor region, a first conductivity type semiconductor region using said mask and selected angles of incidence during ion implantation so that said first conductivity type semiconductor region is self-aligned with respect to said second conductivity type semiconductor region.

2. The method for fabricating a solid state image sensor device according to claim 1, in which said first conductivity type semiconductor region is self-aligned with respect to said surface area of said second conductivity type semiconductor region with a shift being provided therebetween.

3. The method for fabricating a solid state image sensor device according to claim 2, in which said shift is in the order of 0.15 micrometers.

4. The method for fabricating a solid state image sensor device according to claim 1, in which said second conductivity type semiconductor region is ion-implanted with a first incident angle with respect to a line normal to a surface of second conductivity type semiconductor region and said first conductivity type semiconductor region is ion-implanted with a second incident angle with respect to a line normal to a surface of first conductivity type semiconductor region which is larger than said first incident angle.

5. The method for fabricating a solid state image sensor device according to claim 1, in which said mask includes at least one film selected from the group consisting of a photoresist film, a silicon oxide film, and a silicon nitride film.

6. The method for fabricating a solid state image sensor device according to claim 1, in which said first conductivity type semiconductor layer is formed on a substrate of a second conductivity type.

7. A method for fabricating a solid state image sensor device including a photoelectric conversion section which has, in a surface area of a semiconductor layer of a first conductivity type, a semiconductor region of a second conductivity type, and a semiconductor region of the first conductivity type in a surface area of said semiconductor region of the second conductivity type, for fixing a surface potential to a reference level; a signal electron transfer section for transferring a signal electron generated at said photoelectric conversion section, said signal electron transfer section being formed within a surface area of said semiconductor layer of the first conductivity type; and a signal electron read-out section for reading-out said signal electron from said photoelectric conversion section to said signal electron transfer section, said signal electron read-out section being formed within said surface area of said semiconductor layer of the first conductivity type, said method comprising the steps of:

forming a mask above said semiconductor layer of the first conductivity type using a lithographic technique;

forming, within said first surface area of said semiconductor layer of the first conductivity type, said semiconductor region of the second conductivity type by ion-implantation with a first angle of incidence using said mask formed on said semiconductor layer of the first conductivity type; and forming, in said surface area of said semiconductor region of the second conductivity type, said semiconductor region of the first conductivity type using said mask with a second angle of incidence greater than said first angle of incidence so that said semiconductor region is self-aligned with respect to said semiconductor region of the second conductivity type with a shift in a lateral direction opposite to said signal electron read-out section being provided therebetween.

8. The method for fabricating a solid state image sensor device according to claim 7, wherein said shift of said semiconductor region of the first conductivity type with respect to said surface area of said semiconductor region of the second conductivity type is in the order of 0.15 micrometers.

9. The method for fabricating a solid state image sensor device according to claim 7, wherein said mask includes at least one film selected from the group consisting of a photoresist film, a silicon oxide film, and a silicon nitride film.

10. The method for fabricating a solid state image sensor device according to claim 7, wherein said semiconductor layer of the first conductivity type is formed on a semiconductor substrate of an opposite conductivity type.

11. The method for fabricating a solid state image sensor device according to claim 7, wherein said first conductivity type is a P-type and said second conductivity type is an N-type.

12. A method for fabricating a solid state image sensor device, said method comprising the steps of:

forming a mask above a first conductivity type semiconductor layer using a lithographic technique;

forming, in said first conductivity type semiconductor layer, a second conductivity type semiconductor region serving as a photoelectric conversion section by ion implantation using said mask;

forming, in a surface area of said second conductivity type semiconductor region, a first conductivity type semiconductor region using said mask used and selected angles of incidence during the ion implantation so that said first conductivity type semiconductor region is self-aligned with respect to said second conductivity type semiconductor region;

removing said mask formed on said first conductivity type semiconductor layer; and forming a conductive electrode for reading-out an electron signal from said photoelectric conversion section to a signal transfer section, which lies over a part of said first conductivity type semiconductor region, a region from said second conductivity type semiconductor region remaining at said surface area to said signal transfer section, and a part of an element isolation region, with an insulating film being interposed therebetween.

13. A method for fabricating a solid state image sensor device including a photoelectric conversion section which has, in a first surface area of a semiconductor layer of a first conductivity type, a semiconductor region of a second conductivity type, and a semiconductor region of the first conductivity type in a surface area of said semiconductor region of the second conductivity type, for fixing a surface potential to a reference level; a signal electron transfer section for transferring a signal electron generated at said photoelectric conversion section, said signal transfer section being formed within a surface area of said semiconductor layer of the first conductivity type; and a signal electron read-out section for reading-out said signal electron from said photoelectric conversion section to said signal electron transfer section, said signal electron read-out section being formed within said surface area of said semiconductor layer of the first conductivity type, said method comprising the steps of:

forming a mask above said semiconductor layer of the first conductivity type using a lithographic technique;

forming, within said first surface area of said semiconductor layer of the first conductivity type, said semiconductor region of the second conductivity type by ion-implantation with a first angle of incidence using said mask formed on said semiconductor layer of the first conductivity type;

forming, in said surface area of said semiconductor region of the second conductivity type, said semiconductor region of the first conductivity type using said mask with a second angle of incidence greater than said first angle of incidence so that said semiconductor region is self-aligned with respect to said semiconductor region of the second conductivity type with a shift in a lateral direction opposite to said signal electron read-out section being provided therebetween;

removing said mask formed on said semiconductor layer of the first conductivity type; and forming a conductive electrode for reading-out a signal electron from said photoelectric conversion section to said signal transfer section, said conductive electrode lying over a part of said semiconductor region of the first conductivity type, a region from said semiconductor region of the second conductivity type remaining at said surface area to said signal transfer section, and a part of an element isolation region, with an insulating film being interposed therebetween.

* * * * *